(12) United States Patent
Rottstegge

(10) Patent No.: US 6,998,215 B2
(45) Date of Patent: Feb. 14, 2006

(54) NEGATIVE RESIST PROCESS WITH SIMULTANEOUS DEVELOPMENT AND CHEMICAL CONSOLIDATION OF RESIST STRUCTURES

(75) Inventor: Jörg Rottstegge, Lilienthal (DE)

(73) Assignee: Infineon Technologies AG, Munich (DE)

(*) Notice: Subject to any disclaimer, the term of this patent is extended or adjusted under 35 U.S.C. 154(b) by 200 days.

(21) Appl. No.: 10/186,652

(22) Filed: Jul. 1, 2002

(65) Prior Publication Data

US 2003/0064327 A1 Apr. 3, 2003

(30) Foreign Application Priority Data

Jun. 29, 2001 (DE) .......................... 101 31 489

(51) Int. Cl.
G03F 7/20 (2006.01)
G03F 7/30 (2006.01)
G03F 7/32 (2006.01)
G03F 7/38 (2006.01)
G03F 7/004 (2006.01)

(52) U.S. Cl. .............. 430/296; 430/311; 430/313; 430/330; 430/270.1; 430/331

(58) Field of Classification Search ............ 430/296, 430/270.1, 311, 313, 315, 330, 331
See application file for complete search history.

(56) References Cited

U.S. PATENT DOCUMENTS

| 4,491,628 A | * | 1/1985 | Ito et al. ............... 430/176 |
| 5,173,393 A | * | 12/1992 | Sezi et al. ............ 430/323 |
| 5,234,793 A | * | 8/1993 | Sebald et al. ......... 430/323 |
| 5,234,794 A | * | 8/1993 | Sebald et al. ......... 430/325 |
| 6,063,549 A |   | 5/2000 | Schadeli et al. ....... 430/325 |

FOREIGN PATENT DOCUMENTS

EP  0 395 917 B1  6/1997
WO  WO 01/42860 A1  6/2001

OTHER PUBLICATIONS

Grant & Hackh, Chemical Dictionary, 1987, McGraw–Hill, Inc., 5th Edition, p. 22.*

* cited by examiner

Primary Examiner—Mark F. Huff
Assistant Examiner—John Ruggles
(74) Attorney, Agent, or Firm—Laurence A. Greenberg; Werner H. Stemer; Ralph E. Locher

(57) ABSTRACT

A process for producing amplified negative resist structures that includes exposing and contrasting of a resist then simultaneously developing and amplifying the resist to form the amplified resist structures. This substantially simplifies the production of amplified resist structures. Amplifying agents used include bicyclic or polycyclic compounds containing at least one reactive group for attachment to the resist polymer.

11 Claims, 1 Drawing Sheet

NEGATIVE RESIST PROCESS WITH SIMULTANEOUS DEVELOPMENT AND CHEMICAL CONSOLIDATION OF RESIST STRUCTURES

BACKGROUND OF THE INVENTION

Field of the Invention

The invention relates to a process for producing amplified negative resist structures.

In the fabrication of microchips, semiconductor substrates are structured using thin layers of photoresists. The chemical nature of photoresists can be altered selectively by exposure with an electron beam. The exposure can be made with the aid of a photomask or by direct irradiation. Following a developing step, in which either the exposed or the unexposed areas of the photoresist are removed, a structured photoresist is obtained which is used as a mask for the purpose, for example, of etching the semiconductor substrate. In the case of dry etching, the etching operation is completed usually with fluorine or oxygen plasma. In order to carry out selective etching of only the bare areas of the substrate, the mask-forming resist structure must possess sufficient resistance to the plasma that is used. When using an etching plasma containing oxygen, the photoresist therefore usually includes groups containing silicon. In the course of the etching operation, these groups are converted into silicon dioxide, which forms an etch-stable protective layer on the photoresist. The silicon atoms either may already be present in the photoresist polymer or may be introduced into the polymer subsequently, following the development of the resist structure, in a consolidation reaction. For this purpose, reactive groups are provided in the polymer. Examples of reactive groups include acid anhydride groups, carboxyl groups, and acidic phenolic hydroxyl groups. An amplifying agent carrying a corresponding reactive group, an amino group for example, can be chemically attached to the reactive groups.

In order to be able to realize low exposure doses and short exposure times when exposing the photoresist, photoresists known as chemically amplified resists (CARs) have been developed. In this case, the photoresist includes a photosensitive compound that on exposure liberates a catalyst. In a subsequent amplifying step, the catalyst is able to bring about a chemical reaction that changes the chemical nature of the photoresist. With a single quantum of light, which liberates one catalyst molecule, it is therefore possible to bring about a multiplicity of chemical reactions thereby achieving a marked differentiation between the exposed and unexposed areas of the photoresist. The catalyst used is usually a strong acid, which is liberated by a photoacid generator, an onium compound for example. The polymer contains acid-labile groups, such as tertiary butyl groups, which are eliminated under the action of the strong acid liberated. The elimination of the acid-labile group is generally accompanied by the liberation of an acidic group: for example, a carboxyl group or an acidic phenolic hydroxyl group. This brings about a marked change in the polarity of the polymer. The polymer originally used in the photoresist, carrying acid-labile groups, is soluble in apolar solvents or solvent mixtures having a low polarity, such as alkanes, but also in alcohols, ketones, and esters. In contrast, the polymer following elimination of the acid-labile groups is soluble in polar solvents, generally water or basic, aqueous-organic developer solutions.

In connection with the production of resist structures, a range of processes have already been developed, which can be divided into two groups according to principle.

In the case of positive photoresists, the exposed areas of the photoresist are detached in the developing step and in the structured photoresist, for example, form the trenches, whereas the unexposed areas remain on the substrate and form, so to speak, the lines of the photoresist structure.

For producing positive photoresist structures, the procedure described above can be followed. The exposure initiates a chemical reaction within the photoresist. The chemical reaction causes the photoresist polymer to become soluble in alkaline developer solutions: for example, a 2.38% strength solution of tetramethylammonium hydroxide in water. Then, development creates a corresponding positively structured photoresist.

In the case of negative resists, in contrast to the positive-working resists, the exposed portion of the resist remains on the substrate whereas the unexposed portion is removed by the developer solution. When working with chemically amplified negative resists, exposure initially likewise liberates a catalyst, usually a strong acid. The catalyst facilitates crosslinking in the photoresist. As a result, the solubility of the polymer in the developer medium is reduced. The crosslinking causes the exposed area to become insoluble, whereas the unexposed area can be removed in appropriate developers. Developers used are generally aqueous solutions, so that the polymer usually has polar groups in the unexposed state.

For a modification of the developing step, a positive photoresist can also be used to produce a negative resist structure. A process of this kind is described, for example, in U.S. Pat. No. 4,491,628 issued to Ito et al. Ito et al. teach exposing a layer of a positive photoresist attached to a substrate. In this step, an acid is liberated from a photoacid generator. In the subsequent amplifying step, the acid-labile groups in the exposed areas are eliminated by heating, so the polymer is changed to a polar form. In contradistinction to the positive developing process described above, the development is then conducted not with a polar aqueous developer but instead with an apolar solvent. As a result, only the unexposed areas of the substrate, in which the polymer has retained its original apolar form, are detached. Because the polar fractions of the resist, in which polar groups—carboxylic acid groups, for example—have been produced by the exposure, are insoluble in apolar solvents, they remain as lines on the substrate.

Another negative photoresist includes not only a photobase but also a thermoacid. A resist of this kind is described, for example, in International Application No. PCT/DE00/04237. On exposure of the photoresist, a base is liberated in the exposed areas. In a subsequent amplifying step, an acid is liberated from the thermoacid generator by heating. In the exposed areas the acid is neutralized by the base liberated beforehand and is therefore no longer available as a catalyst. In the unexposed areas, the acid catalyses the elimination of the acid-labile groups from the polymer. Accordingly, in the unexposed areas, the polymer is converted from its apolar form into a polar form. In the subsequent developing step, therefore, the unexposed areas can be selectively detached from the substrate using an aqueous-alkaline developer, while the exposed areas remain, so to speak, as lines on the substrate.

As already mentioned, for the etching of the substrate the resist structure must possess sufficient etch resistance. For this purpose, for instance, the lines of the resist structure must have a sufficient layer thickness. This is a particular problem in the case of resists for the 157 nm and the 13 nm technology, because at these wavelengths the photoresists known to date exhibit high absorption. Accordingly, only very thin polymer films can be used, in order to ensure that the radiation used for exposure is able to penetrate even into the deep areas of the resist in sufficient intensity, and liberates sufficient quantities of catalyst. If insufficient quantities of catalyst are liberated in the lower layers of the photoresist, elimination of the acid-labile groups is incomplete or, in a worst-case scenario, does not take place at all. A consequence of this is that following development, residues of the polymer remain in the trenches, forming what are known as resist feet. Owing to its low layer thickness, the resistance of the structured photoresist to an etching plasma is insufficient, which is why its etch resistance must be increased. For thin purpose, following development, the structured resist is chemically amplified. Where the resist structures have a sufficient layer thickness, it is also possible, in addition to an increase in layer thickness, to bring about a narrowing of the trenches, perpendicularly to the substrate surface, by laterally growing layers on the sidewalls of the trenches of the structured resist. As a result, it is possible to achieve an improvement in resolution: that is, for example, the reproduction of narrower conductor tracks. A process of this kind is described, for example, in European Patent EP 0 395 917 B1, which corresponds to U.S. Pat. Nos. 5,234,794 and 5,234,793. In order to amplify the resist structure, the amplifying agent, in solution in a suitable solvent or else from the gas phase, can be applied to the structured resist. The incorporation of silicon-containing amplifying agents into the polymer is generally referred to as silylation.

In fluorine plasma, volatile silicon tetrafluoride is formed from the silicon present in the resist. In this case, amplifying the structured resist with silicon atoms makes no sense. In order to raise the resistance of the resist toward a fluorine plasma, the structured resist is amplified using aromatic amplifying agents. This amplification is referred to as aromatization.

In order to transfer structures produced with very short wave length exposing radiation into a substrate, a resist system including two layers has been used to date. The top layer of the resist system is comparatively thin and photo-structurable. Following exposure, contrasting, and developing, the structured resist is amplified with a silicon-containing amplifying agent and the structure is transferred into the bottom layer of the resist system using an oxygen plasma. The bottom layer is composed, for example, of a resist which, although having a low etch resistance toward an oxygen plasma, possesses a high etch resistance toward a fluorine plasma. A resist of this kind includes polymers having a high aromatic fraction, an example being an etch-resistant novolac, a cresol resin. After the structure of the top resist layer has been transferred into the bottom resist layer with an oxygen plasma, the plasma is changed and the structure is transferred into the substrate using a fluorine plasma. The substrate in this case is composed, for example, of silicon, silicon nitride, or silicon dioxide, so that the material of the substrate can be ablated by the conversion of the silicon, containing substrate into volatile silicon tetrafluoride. Owing to the two-layer resist, the process is relatively expensive and technically complicated by the change of plasma system.

The existing processes for producing amplified resist structures involve a multiplicity of worksteps and are therefore very complicated to conduct. Every workstep also increases the error rate in the fabrication of microchips, meaning that a correspondingly high reject rate must be tolerated. This is also a problem on account of the fact that nondestructive testing is not possible at every step in microchip fabrication. Generally, error testing of this kind is possible only after several production steps, since it is only then that the electrical connections necessary for testing are present in the microchip. In some circumstances, therefore, several weeks may pass between a production step and error testing. Accordingly, an extremely low error rate is required for each production step.

Additionally, the chemical consolidation requires corresponding reactive "anchor" groups in the resist polymer, to which the amplifying agent can be attached. Preparation of these polymers necessitates processes that are likewise complex, since, for example, they must be carried out in the absence of moisture in order to prevent premature hydrolysis of the reactive anchor groups.

SUMMARY OF THE INVENTION

It is accordingly an object of the invention to provide a negative resist process with simultaneous development and chemical consolidation of resist structures that overcomes the hereinafore-mentioned disadvantages of the heretofore-known devices of this general type and that easily produces amplified negative resist structures and features a lower error rate than existing processes.

With the foregoing and other objects in view, there is provided, in accordance with the invention, a process for producing amplified negative resist structures. The first step of the process is applying a chemically amplified resist to a substrate. The resist includes a polymer having a polarity and containing an acid-labile group and an anchor group, a photoacid generator, and a solvent. The acid-labile group is eliminated by acid, can liberate the anchor group, and changes the polarity of the polymer. The next step is removing the solvent to yield a photosensitive resist film. The next step is exposing sections of the photosensitive resist film to liberate an acid from the photoacid generator in the exposed sections of the resist film. The next step is contrasting the exposed resist film by eliminating the acid-labile groups of the polymer with the acid and liberating the anchor groups in the exposed sections of the resist film. The next step is developing the exposed and contrasted resist film with a developer. The developer includes a solvent and an amplifying agent, the amplifying agent including a reactive group for coordinating the anchor groups of the polymer, and a polycyolic aliphatic group. The next step is removing excess developer.

In other words, the object of the invention can be achieved by a process for producing amplified negative resist structures which is characterized by the following steps:

(a) applying a chemically amplified resist to a substrate. The resist includes the following components:

a polymer containing acid-labile groups that are eliminated under the action of acid and liberate an anchor group, bringing about a change in the polarity of the polymer;

a photoacid generator; and a solvent;

(b) removing the solvent to give a photosensitive resist film;

(c) sectionally exposing the resist film by liberating an acid being liberated from the photoacid generator in the exposed sections of the resist film;

(d) contrasting the exposed resist film, the acid-labile groups of the polymer being eliminated by the acid, and the anchor groups liberated, in the exposed sections of the resist film;

(e) developing the exposed and contrasted resist film with a developer. The developer includes the following components:
a solvent in which the polymer containing acid-labile groups is soluble and in which the polymer in which the anchor groups are liberated is substantially insoluble or swellable; and
an amplifying agent containing at least one reactive group which is able to coordinate to the anchor groups of the polymer, and also at least one bicyclic or polycyclic aliphatic group; and
(f) removing excess developer.

In the process of the invention, the resist structure is developed and is amplified with an amplifying agent in one conjoint step. As a result, in comparison to the existing processes, the development of the resist structure with a suitable developer medium in a separate workstep is omitted, together with the subsequent rinsing and drying step. As a result, there is a corresponding reduction in the error rate associated with the production of amplified structured resists. The process of the invention is easier to conduct than the processes used to date and therefore results in a reduction in costs.

The process can be conducted using the photoresists customary for producing positive resist structures. Because amplification is conducted using the exposed areas of the photoresist in which reactive groups are available as a result of the elimination of the acid-labile group, further reactive anchor groups in the polymer are not needed for the attachment of the amplifying agent. It is therefore possible to use photoresists of simpler construction whose sensitivity to hydrolysis is reduced and which are therefore easier to process.

Another advantage of the resist amplified with the process of the invention is that no changeover of plasma system is required when the structure is transferred into the substrate. Implementation of the process of the invention for amplifying structured resists into existing production lines requires no special effort apart from a change in the solvent used for developing and amplifying.

Amplifying agents used are bicyclic or polycyclic compounds that contain at least one reactive group for attachment to the anchor group of the polymer. Amplifying agent parent structures used are bicyclic or polycyclic compounds having from 7 to 20 carbon atoms. Examples of such parent structures are adamantane, norbornane, bicyclo[2,2,2]octane or bicyclo[5,2,1,0$^{2,6}$]decane. Attached to these parent structures, where appropriate via a short spacer, are one or more reactive groups. Spacers used include short alkylene chains having from 1 to 6 carbon atoms, such as a methylene group, an ethylene group, or a propylene group, for example. These spacers carry, preferably at the end, a reactive group. A suitable group, for example, is a hydroxyl group, an amino group, a sulfonic acid group, a thiol group, a carboxyl group, a glycidyl ether, an anhydride group, an imide, an isocyanate group, a urethane, a ketene or an epoxide. The bicyclic or polycyclic groups introduced into the polymer by the amplifying agent bring about an increase in the etch resistance of the photoresist toward a fluorine plasma as achieved in comparable fashion in the case, for example, of amplification with aromatic groups.

Polymers that can be used for the photoresist are those that, following exposure and contrasting, liberate a reactive group that reacts with the amplifying agent. The reaction may lead to the formation of a covalent bond between an anchor group and amplifying agent. However, the amplifying agent may also be attached to the anchor group of the polymer by way of noncovalent bonds, e.g., ionic interactions or dipole-dipole interactions. The polymers must have adequate film-forming properties to be able to produce a uniform film of the photoresist on the substrate. Any polymer can be used which possesses, in the polymer chain or pendantly, acid-labile groups of low alkali solubility which generate reactive groups, such as acidic groups, on the polymer as a result of the catalytic effect of acid and, where appropriate, a simultaneous temperature treatment (contrasting). Examples of suitable acid-labile groups include tert-alkyl ester, tert-butoxycarbonyloxy, tetrahydrofuranyl, tetrahydropyranyl, tert-butyl ether, lactone, or acetal groups. Tert-Butyl ester groups are particularly preferred. The polymer preferably contains groups that increase transparency of the polymer (and hence of the resist layer) to light of very short wavelength, 157 nm for example, such as 1,1,1,3,3,3-hexafluoro-2-hydroxyisopropyl groups, for instance, the hydroxyl function being protected by a tert-butyl ether, tert-butoxycarbonyloxy, tetrahydrofuranyl, tetrahydropyranyl or acetal radical or by another acid-eliminable radical. Following elimination of the protective group, the hydroxyl group can be used as an anchor group in the polymer.

Therefore, the film-forming polymer may be obtained by polymerization or copolymerization of corresponding monomers. Examples of monomers include acrylates, methacrylates, maleic monoesters and diesters, itaconic monoesters and diesters, norbornenecarboxylic esters or else norbornenedicarboxylic monoesters, and diesters. Corresponding repeating units of the polymer are depicted below. Y stands for an acid-labile group, one of the abovementioned groups for example, and R$^1$ for a non-acid-labile radical, an alkyl group having from 1 to 10 carbon atoms for example.

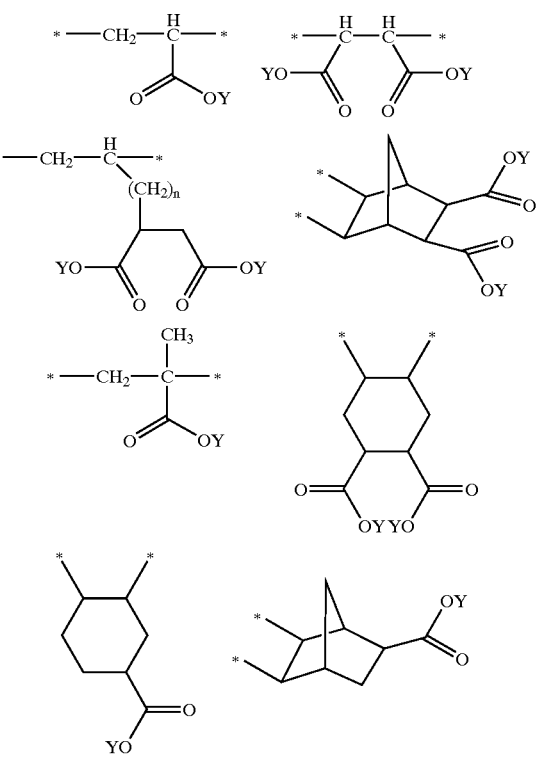

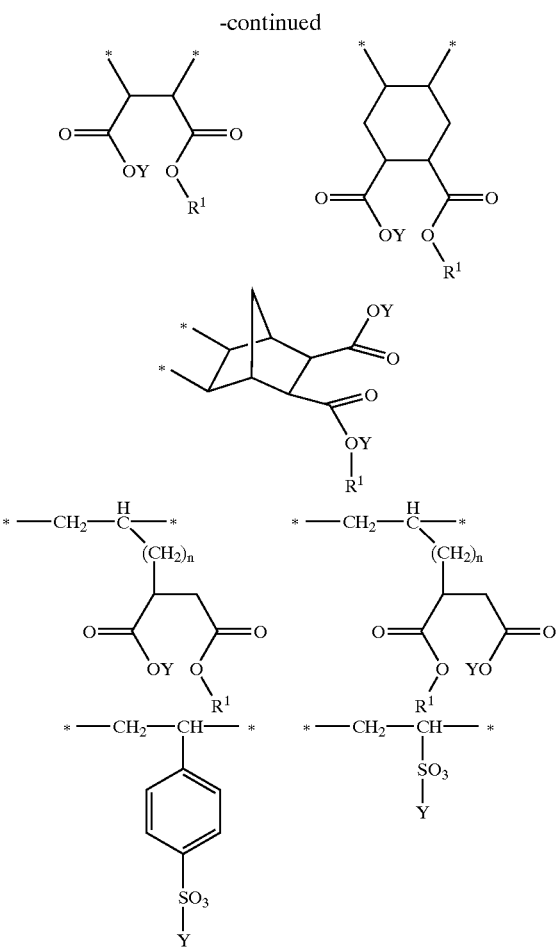

These monomers can be copolymerized with further monomers. One suitable monomer, for example, is styrene. Besides the monomers mentioned, it is also possible to use other monomers customary for the preparation of polymers for photoresists. The photoresist polymer advantageously includes a high fraction of cycloaliphatic groups, since this improves compatibility between amplifying agent and polymer and, owing the better miscibility and interdiffusion of the components, a more rapid amplifying reaction and a larger increase in layer thickness are achieved.

As photoacid generators it is likewise possible to use the photoacid generators which are customary for photoresists. Preference is given to using onium compounds, as described, for example, in European Patent Application EP 0 955 562 A1.

Resist solvents which can be used include, for example, methoxypropyl acetate, cyclopentanone, cyclohexanone, γ-butyrolactone, ethyl lactate, diethylene glycol dimethyl ether, or a mixture of at least two of these compounds. In general, however, all common solvents, or mixtures thereof, that can dissolve the resist components in a clear, homogeneous, and storage-stable solution can be used. Such solvents ensure good layer quality when the substrate is coated.

The photoresist is applied to the substrate by the conventional techniques, such as by spincoating, spray application, or dipping methods. The solvent is subsequently removed by conventional methods. For this purpose, generally speaking, the substrate with the resist film is heated.

Thereafter, the resist film is exposed, for which purpose again the conventional methods can be employed. Exposure may take place, for example, with a photomask or else by direct exposure with focused electrons or ions. The exposing radiation preferably has a wavelength in the range from 10 to 400 nm. In the exposed areas, the photoacid generator liberates an acid, forming a latent image of the desired structure. Exposure of the resist film is followed by a contrasting step in which the latent image is intensified and is impressed into the polymer of the photoresist, so that the photoresist now has a chemical profile. For this purpose, the substrate with the exposed resist film is heated, generally at temperatures from 80 to 200° C. Under the catalytic effect of the acid, the acid-labile groups on the polymer are eliminated and the anchor groups for the attachment of the amplifying agent are liberated. The anchor groups generally have a high polarity, which is why the polymer now likewise has a high polarity and hence a high solubility in polar solvents or a low solubility in apolar solvents. The process of the invention then utilizes the difference in polarity of the polymer in the exposed and unexposed state, in other words its different solubility in the solvent. Where the polymer contains acid-labile ester groups in the unexposed state, then following exposure and contrasting it contains carboxyl groups. The polymer in the unexposed state, therefore, is comparatively apolar and is soluble in apolar or weakly polar solvents, whereas the polymer following exposure and contrasting has a polar nature and is therefore insoluble in apolar or weakly polar solvents. This difference in solubility is then utilized in the developing step. The solvent is selected so that the polymer containing acid-labile groups is soluble and the polymer in which the anchor groups have been liberated is insoluble or swellable. As a result, in the developing step, only the unexposed areas of the substrate are detached and in the unexposed areas trenches are formed in which the substrate is bare. The developer already contains the bicyclic or polycyclic amplifying agent that has at least one reactive group that is able to coordinate to the anchor groups of the polymer. The amplifying agent may therefore be attached to the exposed areas of the photoresist as early as during the developing step, and may act there to increase the layer thickness and etch resistance of the resist. Coordination of the amplifying agent to the polymer takes place preferably by formation of a chemical bond between the anchor groups of the polymer and the reactive group of the amplifying agent, accompanied, for example, by the formation of an amide bond. A salt or a coordination of polar groups also can be formed. In addition, the amide bond may be formed by forming an ammonium salt in the developing/amplifying step from the anchor group and the amplifying agent. Then, in a subsequent production step (e.g., during drying of the developed and amplified resist), the ammonium salt is heated to form an amide bond between the polymer and amplifying agent with elimination of water.

Solvents used for the developer include apolar or weakly polar solvents. All conventional aliphatic, cycloaliphatic, and aromatic solvents are suitable, such as alcohols, aldehydes, ketones, lactones, and esters of low polarity, and also mixtures of those solvents. Examples of suitable solvents are heptane, decane, hexanol, and isopropanol. The solvents may be used individually or in a mixture. A particularly preferred solvent is hexanol. The solvents must take up the components of the developer in the form of an emulsion or, preferably in a clear, homogeneous, and storage-stable solution. In addition, the solvents must not react with the amplifying agent or with the anchor groups present on the polymer.

Following the development and amplification of the resist structure, excess developer is removed with an appropriate solvent and the resist structure is dried.

In order to ensure a reaction rate that is sufficient for practical application when attaching the amplifying agent to the polymer and to ensure a sufficient increase in layer thickness, the composition of the developer should be such that the developer swells the resist in the exposed areas. This allows the amplifying agent to penetrate relatively deep layers of the resist structure, and so permits better amplification. Swelling of the resist in the exposed areas may be achieved simply by an appropriate choice of solvents. If, however, the exposed and contrasted resist exhibits only a very low solubility in the developer solvent, or if it is insoluble in the solvent, it is possible to admix to the developer a swelling promoter that swells the polymer in which the anchor groups are liberated. Suitable swelling promoters include low-molecular-mass, polar compounds, such as water, for instance, low-molecular-mass alcohols, e.g., methanol and ethanol, and low-molecular-mass aldehydes and ketones, such as acetone.

Because the anchor group of the polymer is usually an acidic group, such as a carboxylic acid group or an acidic hydroxyl group, such as phenolic hydroxyl group, the reactive group of the amplifying agent is preferably a basic group. Particularly suitable in this context are amino groups, which are able to react, for example, with a carboxyl group to form an ionic or amide bond.

Particularly preferred amplifying agents are bis (aminomethyl)adamantane, bis(aminoethyl)adamantane, bis (aminopropyl)adamantane, norbornyldiamine, bis(aminomethyl)norbornane, bis(aminoethyl)norbornane, bis(aminopropyl)norbornane, bis(aminomethyl)bicyclo[2.2.2]octane, bis(aminoethyl)bicyclo[2.2.2]octane, bis(aminopropyl)-bicyclo[2.2.2]octane, bis(aminomethyl)tricyclo-[$5.2.1.0^{2,6}$] decane, bis(aminoethyl)tricyclo[$5.2.1.0^{2,6}$]decane, bis (aminopropyl)tricyclo[$5.2.1.0^{2,6}$]decane.

It is also possible to use amplifying agents with a heterocyclic parent structure, such as 1,5-diazabicyclo[4.3.0]non-5-ene, 1,4-diazabicyclo[2.2.2]octane or 1, 8-diazabicyclo [5.4.0]undec-7-ene, for example. The reactivity of the tertiary amino groups present in these compounds is low. For this reason, here again, reactive groups are preferably attached to these parent structures. Examples of groups suitable for this purpose include aminoalkyl groups, such as aminomethyl, aminoethyl, aminopropyl, and aminobutyl groups.

In the process of the invention, the polymer need not per se contain any other groups that act as reaction anchors for consolidation of the resist structure. Such anchor groups are formed in the contrasting step on the acid-catalyzed elimination of the acid-labile groups following exposure, in the form, for instance, of acid groups or (acidic) alcoholic groups. Preferably, in addition to the anchor groups protected by an acid-labile group, the polymers include further reactive anchor groups that are able to react with the reactive group of the amplifying agent to form a covalent bond. In this case, in the course of the amplifying step, there is an irreversible fixing of the amplifying agent on the polymer. Suitable for this purpose in particular are acid anhydride groups provided in the polymer, which are introduced into the polymer by copolymerization of unsaturated carboxylic anhydrides. Examples of suitable monomers are maleic anhydride, itaconic anhydride or methacrylic anhydride. The anchor groups liberated by elimination of the acid-labile groups have the further function, in the case of this variant of the process, of raising the polarity of the polymer and so lowering the solubility of the polymer in the solvent of the amplifying agent.

These reactive anchor groups may also be utilized for further modification of the photoresist. By way of example, the insolubility of the exposed areas in the developer can be increased further if further crosslinking of the polymer is brought about. This can be achieved, for example, by the amplifying agent containing at least two reactive groups. Compounds suitable for this purpose include, for example, the bicyclic or polycyclic aliphatic compounds, already mentioned above, which are functionalized by two amino groups.

The components described above are preferably used in the resist in the following proportions:

film-forming polymer: 1–50% by weight, preferably 2–10% by weight;

photoacid generator: 0.01–10% by weight, preferably 0.1–1% by weight; and solvent: 80–99% by weight, preferably 88–97% by weight.

The components described can be used in the developer in the following proportions:

amplifying agent: 0.1–10% by weight, preferably 2–3% by weight;

swelling promoter: 0.01–10% by weight, preferably 0.5–2% by weight; and solvent: 80–99% by weight, preferably 92–97% by weight.

Other features that are considered as characteristic for the invention are set forth in the appended claims.

Although the invention is illustrated and described herein as embodied in a negative resist process with simultaneous development and chemical consolidation of resist structures, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
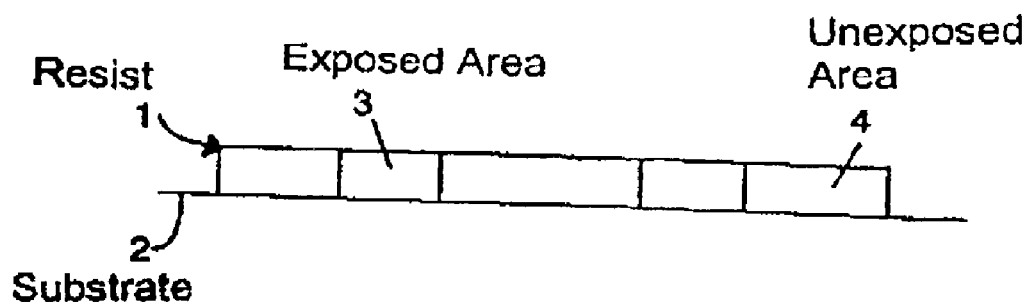
FIG. 1A is a partial diagrammatic and partial schematic sectional view showing a photoresist following exposure and contrasting.
Figure 1B:
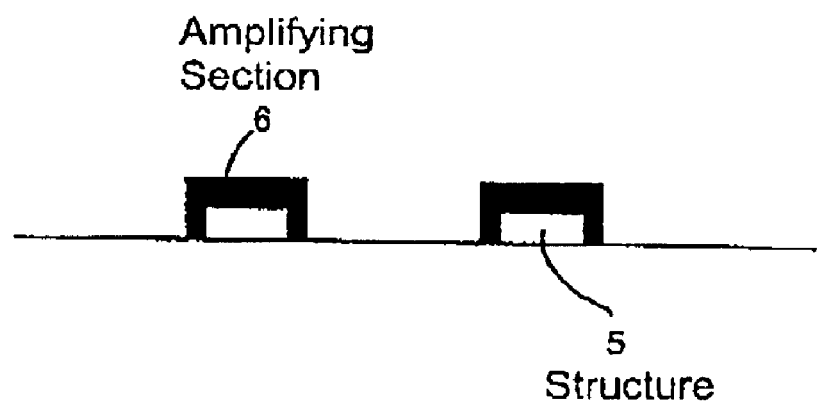
FIG. 1B shows the photoresist following chemical consolidation.

Referring now to the figures of the drawings in detail and first, particularly to FIG. 1A thereof, there is shown a resist 1 applied to a substrate 2. The resist includes a polymer containing polar groups which are protected with an acid-labile group. The substrate 2 may be, for example, a silicon wafer or a layer of silicon dioxide or silicon nitride or an anti-reflective coating applied to the silicon wafer. Application takes place by the customary techniques, such as by spin coating. Thereafter, the resist film is dried and then exposed. Since the photoresist includes a photoacid generator, an acid is liberated in the exposed area 3 and forms a latent image of the structure. In the unexposed area 4, no acid is liberated. In the contrasting step, which is accompanied by heating, in the exposed area 3 the acid-labile groups on the polymer are eliminated under the action of the liberated acid, and the polar groups are liberated on the polymer. In the exposed area 3, therefore, the polymer is polar and insoluble in apolar solvents, whereas in the unexposed area 4 it is apolar and hence soluble in apolar solvents. In the developing amplifying step, the unexposed area 4 is detached from the substrate 2, while in the exposed area 3 the resist remains on the substrate 2. The amplifying agent has deposited itself on the outside of the structure 5 to form an amplifying section 6. The amplifying agent has undergone partial diffusion into the exposed areas 3 of the resist, so that the amplifying area 6 also extends over sections of the exposed area 3.

I claim:

1. A process for producing amplified negative resist structures, which comprises:

applying a chemically amplified resist to a substrate, the resist including:

a polymer having a polarity and containing an acid-labile group and a bound anchor group, the acid-labile group being eliminable by acid and being able to liberate the anchor group to change the polarity of the polymer;

a photoacid generator; and a first solvent;

removing the solvent to yield a photosensitive resist film;

exposing sections of the photosensitive resist film to generate an acid from the photoacid generator in the exposed sections of the resist film;

contrasting the exposed resist film by eliminating the acid-labile group of the polymer with the acid and liberating the anchor group in the exposed sections of the resist film to change the polarity of the polymer;

developing the exposed and contrasted resist film with a developer, the developer including:

a second solvent for dissolving the polymer containing acid-labile groups, and not dissolving and swelling the polymer containing the liberated anchor groups;

an amplifying agent having a reactive group for coordinating the anchor groups of the polymer, and a polycyclic non-aromatic group; and removing excess of the developer, thus producing an amplified negative resist structure on the substrate.

2. The process according to claim 1, wherein the polycyclic non-aromatic group of the amplifying agent is bicyclic.

3. The process according to claim 1, wherein the developer includes a swelling promoter for swelling the polymer having liberated anchor groups.

4. The process according to claims 1, wherein the second solvent of the developer is apolar.

5. The process according to claim 1, wherein the second solvent of the developer has a low polarity.

6. The process according to claim 1, wherein the polymer includes further reactive anchor groups for bonding with the reactive group of the amplifying agent.

7. The process according to claim 1, wherein the amplifying agent includes at least two reactive groups.

8. The process according to claim 1, wherein the reactive group of the amplifying agent is selected from the group consisting of a hydroxyl group, an amino group, a sulfonic acid group, a thiol group, a carboxyl group, a glycidyl ether, an anhydride group, an imide, an isocyanate group, a urethane, a ketene, and an epoxide.

9. The process according to claim 1, wherein the reactive group of the amplifying agent is basic.

10. The process according to claim 1, wherein the amplifying agent is selected from the group consisting of bis(aminomethyl)adamantane, bis(aminoethyl)adamantane, bis(aminopropyl)adamantane, norbornyldiamine, bis(aminomethyl)norbornane, bis(aminoethyl) norbornane, bis(aminopropyl)norbornane, bis(aminomethyl)bicyclo[2,2,2]octane, bis(aminoethyl)bicyclo [2,2,2]octane, bis(aminopropyl)bicyclo [2,2,2]octane, bis(aminomethyl) tricyclo[5,2,1,0$^{2,6}$]decane, bis(aminoethyl)tricyclo[5,2,1,0$^{2,6}$]decane, and bis(aminopropyl) tricycle [5,2,1,0$^{2,6}$]decane.

11. The process according to claim 1, wherein the second solvent of the developer is selected from the group consisting of hexanol, isopropanol, heptane, and decane.

* * * * *